(12) United States Patent
Wohlmuth

(10) Patent No.: US 11,876,128 B2
(45) Date of Patent: Jan. 16, 2024

(54) FIELD EFFECT TRANSISTOR

(71) Applicant: Walter Tony Wohlmuth, Taipei (TW)

(72) Inventor: Walter Tony Wohlmuth, Taipei (TW)

( * ) Notice: Subject to any disclaimer, the term of this patent is extended or adjusted under 35 U.S.C. 154(b) by 74 days.

(21) Appl. No.: 17/473,102

(22) Filed: Sep. 13, 2021

(65) Prior Publication Data

US 2023/0080772 A1  Mar. 16, 2023

(51) Int. Cl.
*H01L 29/778* (2006.01)
*H01L 29/205* (2006.01)
*H01L 29/08* (2006.01)
*H01L 29/47* (2006.01)

(52) U.S. Cl.
CPC ...... *H01L 29/7784* (2013.01); *H01L 29/0891* (2013.01); *H01L 29/205* (2013.01); *H01L 29/475* (2013.01)

(58) Field of Classification Search
CPC .............. H01L 29/778; H01L 29/7789; H01L 29/0891; H01L 29/205; H01L 29/475
See application file for complete search history.

(56) References Cited

U.S. PATENT DOCUMENTS

| | | | | |
|---|---|---|---|---|
| 8,288,260 B1 * | 10/2012 | Hanson | ............ | H01L 29/42316 257/E31.127 |
| 2009/0026501 A1 * | 1/2009 | Maher | ................. | H01L 27/095 257/E21.445 |
| 2009/0267078 A1 * | 10/2009 | Mishra | .................. | H01L 29/365 257/E21.403 |
| 2010/0102358 A1 * | 4/2010 | Lanzieri | ............. | H01L 29/7785 257/E21.403 |

FOREIGN PATENT DOCUMENTS

EP  0514079 A2 *  5/1992

OTHER PUBLICATIONS

Wikipedia The free encyclopedia: High-electron-mobility transistor, 2018.*
Harris, J.J. Delta-doping of semiconductors. J Mater Sci: Mater Electron 4, 93-105 (1993). https://doi.org/10.1007/BF00180462.*

* cited by examiner

*Primary Examiner* — Matthew L Reames
*Assistant Examiner* — Fakeha Sehar
(74) *Attorney, Agent, or Firm* — Rosenberg, Klein & Lee

(57) ABSTRACT

A field effect transistor comprising: a first semiconductor structure, the first semiconductor structure having a channel layer; a second semiconductor structure, the second semiconductor structure is arranged on the first semiconductor structure, and the second semiconductor structure is stacked in sequence from bottom to top with a Schottky layer, a first etch stop layer, a wide recess layer, an ohmic contact layer, and a narrow recess, a wide recess is opened in the ohmic contact layer, so that the upper surface of the wide recess layer forms a wide recess area and the upper surface of the Schottky layer forms a narrow recess area; at least one delta-doped layer, a gate metal contact, the gate metal contact is formed inside the wide recess a source metal contact; and a drain metal contact, and the drain metal contact is located on the other side of the gate metal contact.

19 Claims, 14 Drawing Sheets

FIELD EFFECT TRANSISTOR

BACKGROUND OF THE INVENTION

1. Field of the Invention

The invention relates to a field effect transistor especially the one that having a delta-doped layer.

2. Description of the Related Art

Electrons are injected from the Source to the Drain due to applied voltage (Vds). The electrons transit from the Ohmic metal of the Source down into the channel layer, transit along the Channel to the Drain and are swept up in the Ohmic metal of the Drain. The Gate contact modulates the current in the channel restricting or opening up the flow of electrons from Source to Drain The transit time of the electrons from Source to Drain is affected by the resistance of the channel in the gated regions and the ungated regions. The speed of the device is directly proportional to the transit time. The transconductance of the HEMT is degraded by gate-source resistance and the transconductance impacts the gain of the device. Parasitic resistances increase I-R losses (voltage drops) in a device. Reduction of the electric field at the drain side of the gate allows the device to operate at higher voltages prior to the onset of avalanche breakdown and higher voltage operation enables higher output power when the HEMT is operated as a power amplifier.

SUMMARY OF THE INVENTION

It is a primary objective of the present invention is to provide a field effect transistor, which improves large-signal RF performance through the reduction of parasitic resistance and modified electric field distribution to have better efficiency, output power, gain, breakdown voltage and bandwidth of RF transistors and power amplifiers.

Another objective of the present invention is to provide a field effect transistor, with reduced parasitic resistance enabling better performance in high frequency applications such as millimeter-wave 5G and 6G.

In order to achieve the above objectives, the field effect transistor, includes a first semiconductor structure, the first semiconductor structure including a channel layer; a second semiconductor structure, the second semiconductor structure is arranged on the first semiconductor structure, and the second semiconductor structure is stacked in sequence from bottom to top with a Schottky layer, a first etch stop layer, a wide recess layer, an ohmic contact layer, and a narrow recess is opened in the wide recess layer, a wide recess is opened in the ohmic contact layer and the wide recess is located above the narrow recess, so that the upper surface of the wide recess layer forms a wide recess area and the upper surface of the Schottky layer forms a narrow recess area; at least one delta-doped layer, the delta-doped layer is placed in a predetermined position in the second semiconductor structure; a gate metal contact, the gate metal contact is formed inside the wide recess and at the bottom surface of the narrow recess to a predetermined position within the narrow recess area;

a source metal contact, the source metal contact is arranged on the ohmic contact layer, and the source metal contact is located on one side of the gate metal contact; and a drain metal contact, the drain metal contact is arranged on the ohmic contact layer, and the drain metal contact is located on the other side of the gate metal contact.

Moreover, the wide recess layer is n-type doped either at a uniform constant value or graded doping with the peak doping at the top surface of the wide recess.

Moreover, the graded doping is either linear, step-graded, quadratic-graded, exponential, or combination thereof.

Moreover, the field effect transistor can be a high electron mobility transistor, a pseudo-morphic high electron mobility transistor (pHEMT), a heterostructure FET (HFET), or a modulation-doped FET (MODFET).

Moreover, the transistor is a depletion-mode, normally-on transistor or an enhancement-mode, normally-off transistor.

Moreover, the delta-doped layer in an epitaxy material grown by molecular beam epitaxy (MBE), metallo-organic chemical vapor deposition (MOCVD) or a combination thereof.

Moreover, the thickness of the MBE grown delta-doped layer is 1 to 2 monolayers (ML) thick, 0.5 to 1.2 nm.

Moreover, the thickness of the MOCVD grown delta-doped layer is one to a few monolayers thick.

Moreover, the epitaxy materials are Gallium Arsenide (GaAs) based materials.

Moreover, the delta-doped layer can be inserted into the wide recess region in the wide recess layer.

Moreover, the wide recess layer includes a first layer and a second layer, the first layer is located between the upper surface of the delta-doped layer and the upper surface of the wide recess layer, and the second layer is located between the lower surface of the delta-doped layer and the lower surface of the wide recessed layer, and the thickness of the first layer is greater than or equal to the thickness of the second layer.

Moreover, the material of the first layer and the second layer is n-type AlGaAs.

Moreover, the thickness of the first layer is 10-20 nm; the thickness of the second layer is 1-10 nm, and the doping species is Si and the Si doping concentration is 1~5e17 cm−3.

Moreover, the thickness of the first layer is 9 nm; the thickness of the second layer is 1 nm, the doping species is Si and the Si doping concentration is 3e17 cm−3.

Moreover, the gate metal contact is formed sequentially of Ti—Pt—Au, Ti—Pt—Au—Ti, Ti—Mo—Au, Ti—Mo—Au—Ti, Ti—Pd—Au, Ti—Pd—Au—Ti on the upper surface of the Schottky layer in the narrow recess area.

Moreover, the gate metal contact is formed sequentially of Pt—Ti—Pt—Au, Pt—Ti—Pt—Au—Ti, Pt—Ti—Mo—Au, Pt—Ti—Mo—Au—Ti, Pt—Ti—Pd—Au, or Pt—Ti—Pd—Au—Ti on the upper surface of the Schottky layer in the narrow recess area and wherein a thermal treatment is performed to intermix the initial Pt layer and the second semiconductor structure material to form the gate metal contact to the second semiconductor structure junction below the upper surface of the Schottky layer in the narrow recess area.

Moreover, the delta-doped layer can be inserted into the narrow recess region and the between the lower surface of the Schottky layer and wherein the gate metal contact is formed sequentially of Pt—Ti—Pt—Au, Pt—Ti—Pt—Au—Ti, Pt—Ti—Mo—Au, Pt—Ti—Mo—Au—Ti, Pt—Ti—Pd—Au, or Pt—Ti—Pd—Au—Ti on the upper surface of the Schottky layer in the narrow recess area and wherein a thermal treatment is performed to intermix the initial Pt layer and the second semiconductor structure material to form the gate metal contact to the second semiconductor structure junction below the upper surface of the Schottky layer and additionally below the delta-doped layer and in the narrow recess area.

Moreover, the second semiconductor structure includes a second etch stop layer, the second etch stop layer is arranged between the wide recess layer and the ohmic contact layer.

Moreover, the material of the Schottky layer is n-type AlGaAs; the material of the first etch stop layer is n-type InGaP or n-type AlAs; the material of the wide recess layer is n-type AlGaAs; the material of the delta-doped layer is n-type GaAs or n-type AlGaAs; the material of the second etch stop layer is n-type InGaP or n-type AlAs; the material of the ohmic contact layer is n-type GaAs or n-type InGaAs, or combination thereof.

Moreover, the Schottky layer has a thickness of 5-20 nm and the doping species is Si and the Si doping concentration is 1~3e17 cm−3; the thickness of the first etch stop layer is 5 nm, the doping species is Si and the Si doping concentration is greater than 1e19 cm−3; the thickness of the delta-doped layer is 1 ML, the doping species is Si and the Si doping concentration is 0.5~1.5e12 cm−2; the thickness of the second etch stop layer is 5 nm, the doping species is Si and the Si doping concentration is greater than 1e19 cm−3; the thickness of the ohmic contact layer is 20-120 nm, the doping species is Si, and the Si doping concentration is greater than 5e18 cm−3.

Moreover, the Schottky layer has a thickness of 10 nm and the doping species is Si and the Si doping concentration is 3e17 cm−3; the thickness of the first etch stop layer is 5 nm, the doping species is Si and the Si doping concentration is greater than 1e19 cm−3; the delta-doped layer, the thickness is 1 ML the doping species is Si and the Si doping concentration is 1.0e12 cm−2; the thickness of the second etch stop layer is 5 nm, the doping species is Si, and the Si doping concentration is greater than 1e19 cm−3, the thickness of the ohmic contact layer is 50 nm, the doping species is Si and the Si doping concentration is greater than 5e18 cm−3.

Moreover, the first semiconductor structure includes a substrate and a buffer layer, a super-lattice buffer layer, a transition layer, a first delta-doped layer, a first spacer layer, a second spacer layer, a second delta-doped layer, and the first semiconductor structure stacks the substrate, the buffer layer, and the super-lattice buffer layer, the transition layer, the first delta-doped layer, the first spacer layer, the channel layer, the second spacer layer and the second delta-doped layer sequentially from bottom to top.

Moreover, the material of the substrate is semi-insulating GaAs; the material of the buffer layer is unintentionally-doped GaAs; the material of the super-lattice buffer layer is AlGaAs/GaAs; the material of the transition layer is unintentionally-doped GaAs; the material of the first delta-doped layer is n-type GaAs; the material of the first spacer layer is unintentionally-doped AlGaAs; the material of the channel layer is unintentionally-doped InGaAs; the material of the second spacer layer is unintentionally-doped AlGaAs; the second material of the delta-doped layer is n-type GaAs.

With the feature disclosed above, the present invention improves the performance of the field effect transistor, wherein the gate metal contact to the second semiconductor structure and the delta-doped layer is inserted into the second semiconductor structure lowers the resistance between gate-drain and gate-source and reduces the electric field at the drain edge of the gate thereby improving off-state and on-state breakdown voltage as well as improving efficiency, output power, gain, breakdown voltage and bandwidth of RF transistors and power amplifiers.

DETAILED DESCRIPTION OF THE PREFERRED EMBODIMENT

Figure 1:
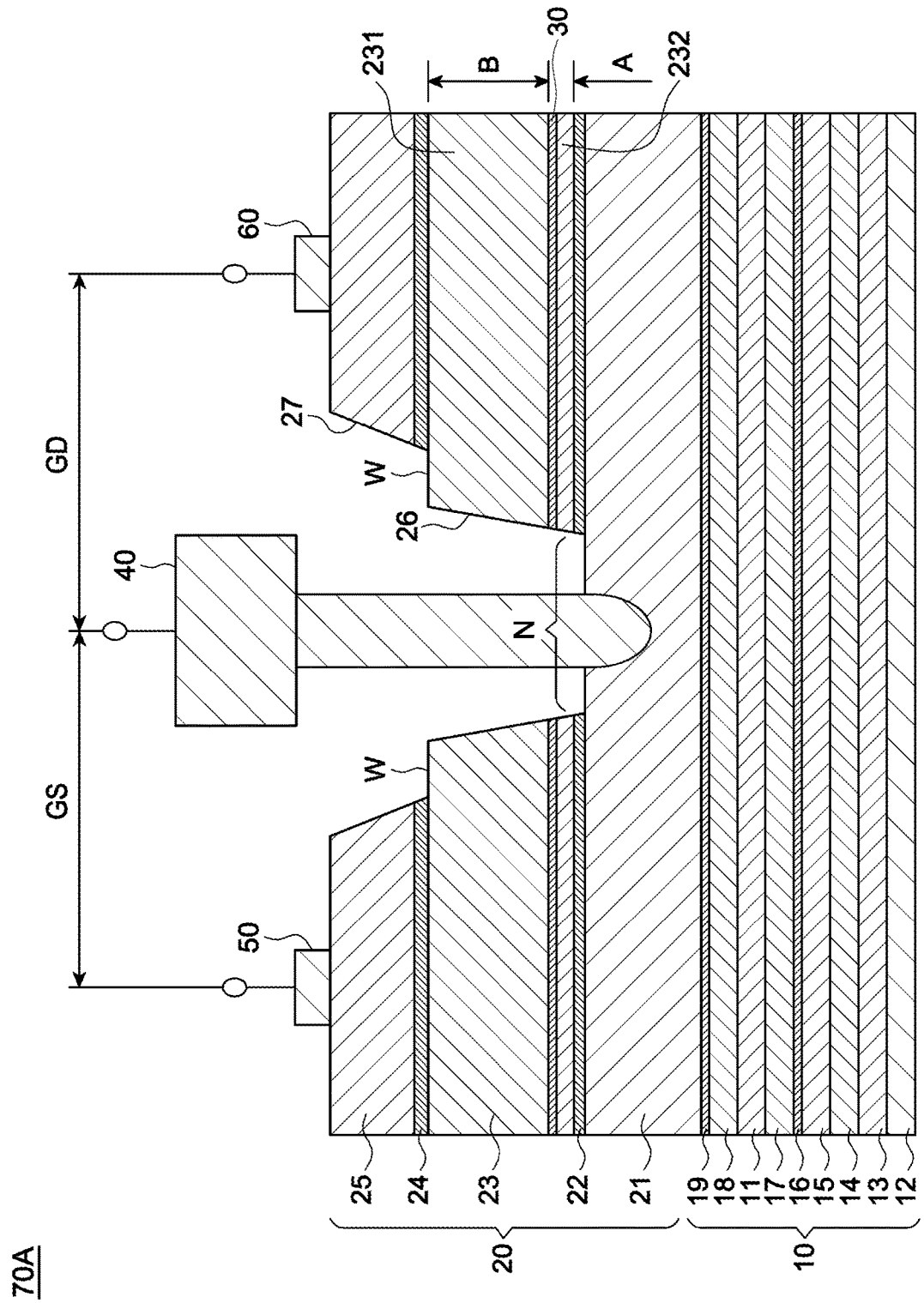
FIG. 1 is a schematic diagram of a field effect transistor of the first embodiment of the present invention.

Referring to FIGS. 1-11, the present invention is a field effect transistor 70A, 70B, 70C, the field effect transistor 70A, 70B, 70C can be a high electron mobility transistor, a pseudo-morphic high electron mobility transistor (pHEMT), a heterostructure FET (HFET), or a modulation-doped FET (MODFET). The field effect transistor 70A, 70B, 70C is a depletion-mode, normally-on transistor or an enhancement-mode, normally-off transistor, including a first semiconductor structure 10, the first semiconductor structure 10 having a channel layer 11, in this embodiment, the first semiconductor structure 10 includes a substrate 12, a buffer layer 13, a super-lattice buffer layer 14, a transition layer 15, a first delta-doped layer 16, a first spacer layer 17, a second spacer layer 18, a second delta-doped layer 19, and the first semiconductor structure 10 stacks the substrate 12, the buffer layer 13, and the super-lattice buffer layer 14, the transition layer 15, the first delta-doped layer 16, the first spacer layer 17, the channel layer 11, the second spacer layer 18 and the second delta-doped layer 19 sequentially from bottom to top, but the present invention is not limited to such application.

Also, the material of the substrate 12 is semi-insulating GaAs; the material of the buffer layer 13 is unintentionally-doped GaAs; the material of the super-lattice buffer layer 14 is AlGaAs/GaAs; the material of the transition layer 15 is unintentionally-doped GaAs; the material of the first delta-doped layer 16 is n-type GaAs; the material of the first spacer layer 17 is unintentionally-doped AlGaAs; the material of the channel layer 11 is unintentionally-doped InGaAs; the material of the second spacer layer 18 is unintentionally-doped AlGaAs; the second material of the delta-doped layer 19 is n-type GaAs, but the present invention is not limited to such application.

A second semiconductor structure 20, the second semiconductor structure 20 is arranged on the first semiconductor structure 10, and the second semiconductor structure 20 is stacked in sequence from bottom to top with a Schottky layer 21, a first etch stop layer 22, a wide recess layer 23, an ohmic contact layer 25; and a narrow recess 26 is opened in the wide recess layer 23, a wide recess 27 is opened in the ohmic contact layer 25 and the wide recess 27 is located above the narrow recess 26, so that the upper surface of the wide recess layer 23 forms a wide recess area W and the upper surface of the Schottky layer 21 forms a narrow recess area N; in this embodiment, the second semiconductor structure 20 includes a second etch stop layer 24, and the second etch stop layer 24 is arranged between the wide recess layer 23 and the ohmic contact layer 25, but the present invention is not limited to such application.

Also, the material of the Schottky layer 21 is n-type AlGaAs; the material of the first etch stop layer 22 is n-type InGaP or n-type AlAs; the material of the wide recess layer 23 is n-type AlGaAs; the material of the delta-doped layer 30 is n-type GaAs or n-type AlGaAs; the material of the second etch stop layer 24 is n-type InGaP or n-type AlAs; the material of the ohmic contact layer 25 is n-type GaAs or n-type InGaAs, or combination thereof, but the present invention is not limited to such application.

Also, the Schottky layer 21 has a thickness of 5-20 nm and the doping species is Si and the Si doping concentration is 1~3e17 cm−3; the thickness of the first etch stop layer 22 is 5 nm, the doping species is Si and the Si doping concentration is greater than 1e19 cm−3; the thickness of the delta-doped layer 30 is 1 ML, the doping species is Si and the Si doping concentration is 0.5~1.5e12 cm−2; the thickness of the second etch stop layer 24 is 5 nm, the doping species is Si and the Si doping concentration is greater than 1e19 cm−3; the thickness of the ohmic contact layer 25 is 20-120 nm, the doping species is Si, and the Si doping concentration is greater than 5e18 cm−3, but the present invention is not limited to such application.

Also, the Schottky layer 21 has a thickness of 10 nm and the doping species is Si and the Si doping concentration is 3e17 cm−3; the thickness of the first etch stop layer 22 is 5 nm, the doping species is Si and the Si doping concentration is greater than 1e19 cm−3; the delta-doped layer 30, the thickness is 1 ML, the doping species is Si and the Si doping concentration is 1.0e12 cm−2; the thickness of the second etch stop layer 24 is 5 nm, the doping species is Si, and the Si doping concentration is greater than 1e19 cm−3, the thickness of the ohmic contact layer 25 is 50 nm, the doping species is Si and the Si doping concentration is greater than 5e18 cm−3, but the present invention is not limited to such application.

Also, at least one delta-doped layer 30, the delta-doped layer 30 is placed in a predetermined position in the second semiconductor structure 20; in this embodiment, the delta-doped layer 30 is grown by molecular beam epitaxy (MBE), metallo-organic chemical vapor deposition (MOCVD) or a combination thereof; the thickness of the MBE grown delta-doped layer 30 is 1 to 2 monolayers (ML) thick, 0.5 to 1.2 nm; the thickness of the MOCVD grown delta-doped layer 30 is one to a few monolayers thick; the epitaxy materials are Gallium Arsenide (GaAs) based materials, but the present invention is not limited to such application.

A gate metal contact 40, the gate metal contact 40 is formed inside the wide recess 27 and at the bottom surface of the narrow recess 26 to a predetermined position within the narrow recess area N; a source metal contact 50, the source metal contact 50 is arranged on the ohmic contact layer 25, and the source metal contact 50 is located on one side of the gate metal contact 40; and a drain metal contact 60, the drain metal contact 60 is arranged on the ohmic contact layer 25, and the drain metal contact 60 is located on the other side of the gate metal contact 40.

Referring to FIGS. 1-4, illustrating the field effect transistor 70A of the first embodiment, wherein the delta-doped layer 30 can be inserted into the wide recess region W in the wide recess layer 23; the wide recess layer 23 includes a first layer 231 and a second layer 232, the first layer 231 is located between the upper surface of the delta-doped layer 30 and the upper surface of the wide recess layer 23, and the second layer 232 is located between the lower surface of the delta-doped layer 30 and the lower surface of the wide recessed layer 23, and the thickness B of the first layer 231 is greater than or equal to the thickness A of the second layer 232; in this embodiment, the material of the first layer 231 and the second layer 232 is n-type AlGaAs; the thickness of the first layer 231 is 10-20 nm; the thickness of the second layer 232 is 1~10 nm, and the doping species is Si and the Si doping concentration is 1~5e17 cm−3; the thickness of the first layer 231 is 9 nm; the thickness of the second layer 232 is 1 nm, the doping species is Si and the Si doping concentration is 3e17 cm−3, but the present invention is not limited to such application.

Figure 2:
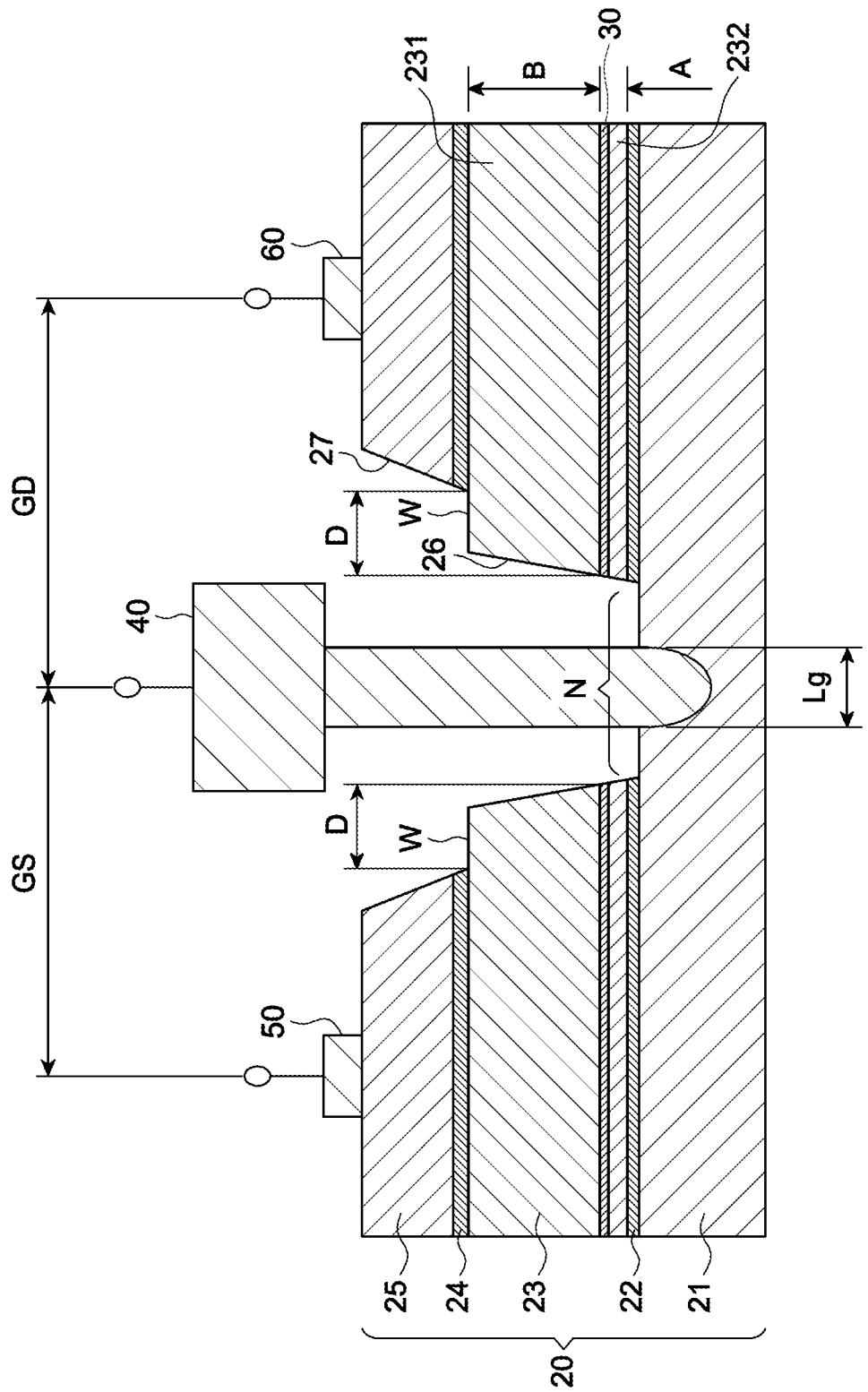
FIG. 2 is a schematic diagram illustrating the structure of the gate metal contact and the second semiconductor structure of the first embodiment of the present invention.

Referring to FIG. 2, the electric field profile in the gate-drain GD region is reduced under applied Vds. The electric field will peak at the drain-side of the gate and the onset of impact ionization due to higher electric fields limits the breakdown of a field effect transistor 70A. Extending the breakdown voltage enables the field effect transistor 70A to operate at high power density. The resistance in the gate-source GS and gate-drain GD region is reduced and the reduction of these parasitic resistances improves gain, output power, bandwidth and efficiency of the transistor and power amplifiers as well as improving the noise characteristics of low-noise amplifiers; the Ohmic contact layer 25 resistance can be improved by enabling electrons to be more efficiently injected from the source metal contact 50 into the channel layer 11 and from the channel layer 11 into the drain metal contact 60; and the wide recess region 23 has electron e and hole traps D at the interface and along the sidewalls, the traps D can affect device performance and by using a wide recess 23 delta doping layer 30, the traps D are screened from the channel layer 11 below the Schottky layer 21.

Figure 4:
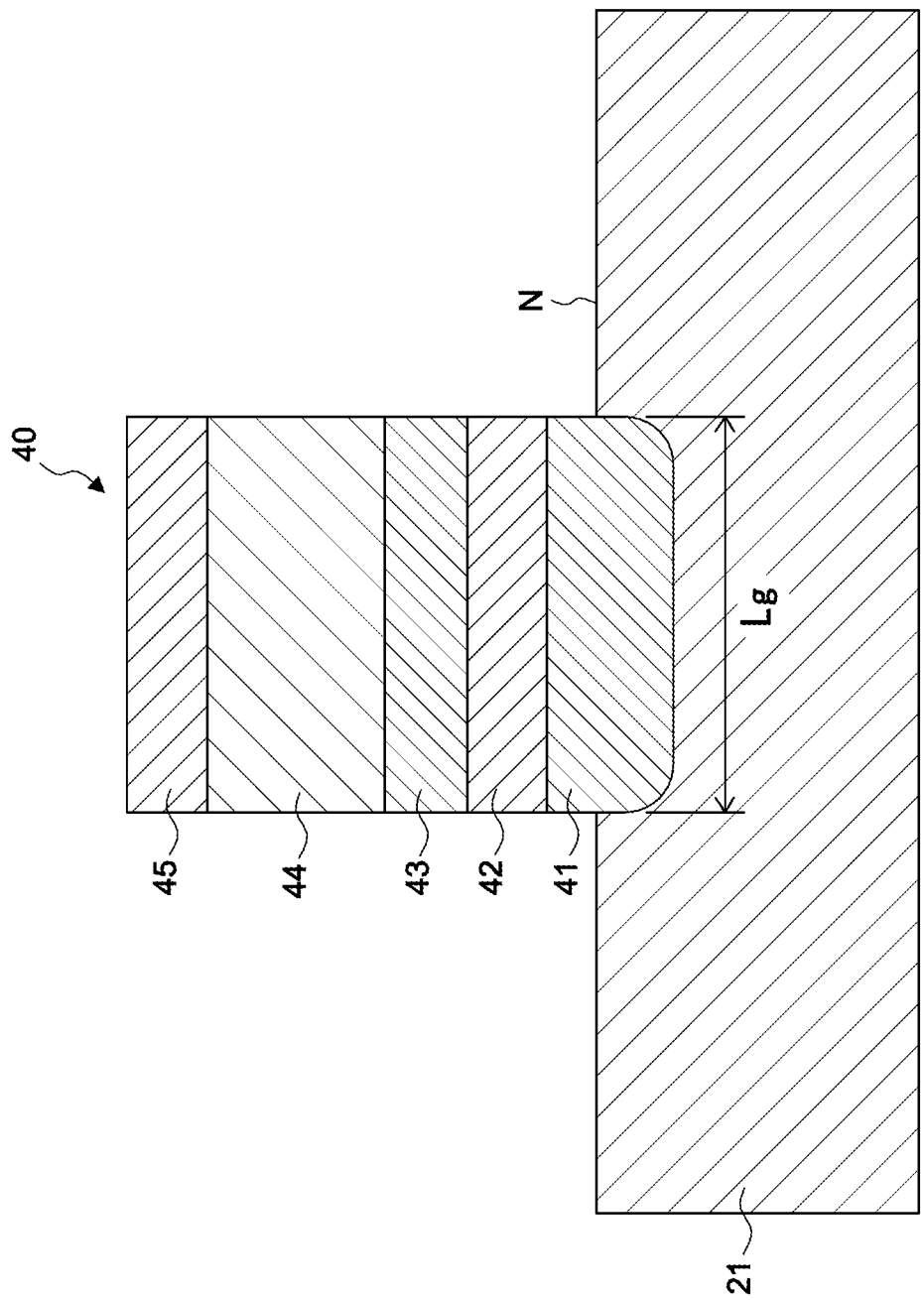
FIG. 4 is a schematic diagram illustrating the gate metal contact combining with the Schottky layer of the first embodiment of the present invention.

Referring to FIG. 4, the gate metal contact 40 is formed sequentially of Pt—Ti—Pt—Au, Pt—Ti—Pt—Au—Ti, Pt—Ti—Mo—Au, Pt—Ti—Mo—Au—Ti, Pt—Ti—Pd—Au, or Pt—Ti—Pd—Au—Ti on the upper surface of the Schottky layer 21 in the narrow recess area N and wherein a thermal treatment is performed to intermix the initial Pt layer 41 and the second semiconductor structure 20 material to from the gate metal contact 40 to the second semiconductor structure 20 junction below the upper surface of the Schottky layer 21 in the narrow recess area N; in this embodiment, the initial Pt layer 41 intermixes with the n-type AlGaAs Schottky layer 21 at a temperature of 300-400° C.; and for further describing the gate metal contact 40 the Pt—Ti—Pt—Au—Ti is sequentially formed with the initial Pt layer 41, the initial Ti layer 42, the second Pt layer 43, the Au layer 44, the second Ti layer 45; and the bottom Lg of the Pt layer 41 has a rounded corner and flat interface, but the present invention is not limited to such application.

Figure 5:
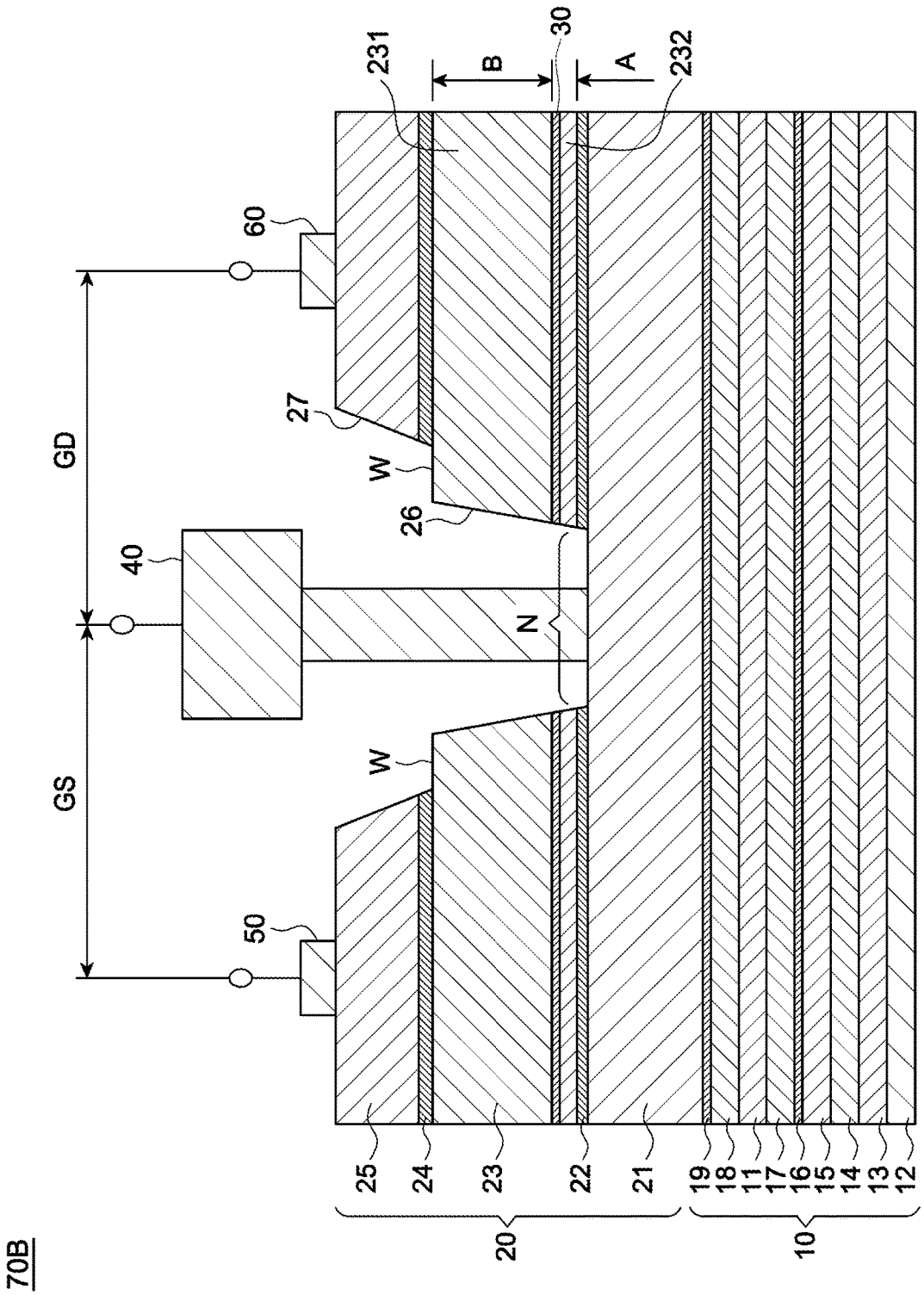
FIG. 5 is a schematic diagram of a field effect transistor of the second embodiment of the present invention.
Figure 6:
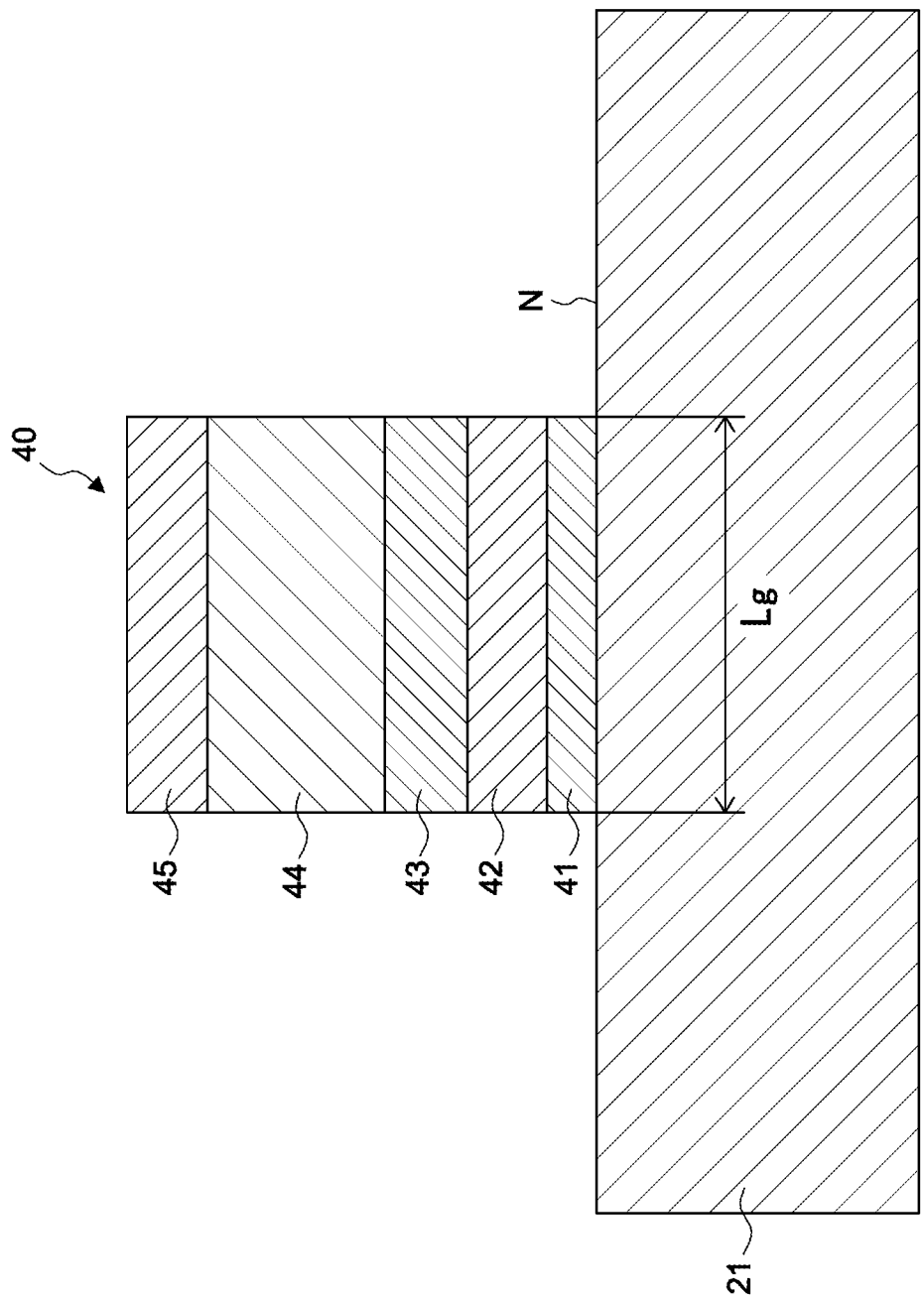
FIG. 6 is a schematic diagram illustrating the gate metal contact combining with the Schottky layer of the second embodiment of the present invention.
Figure 7:
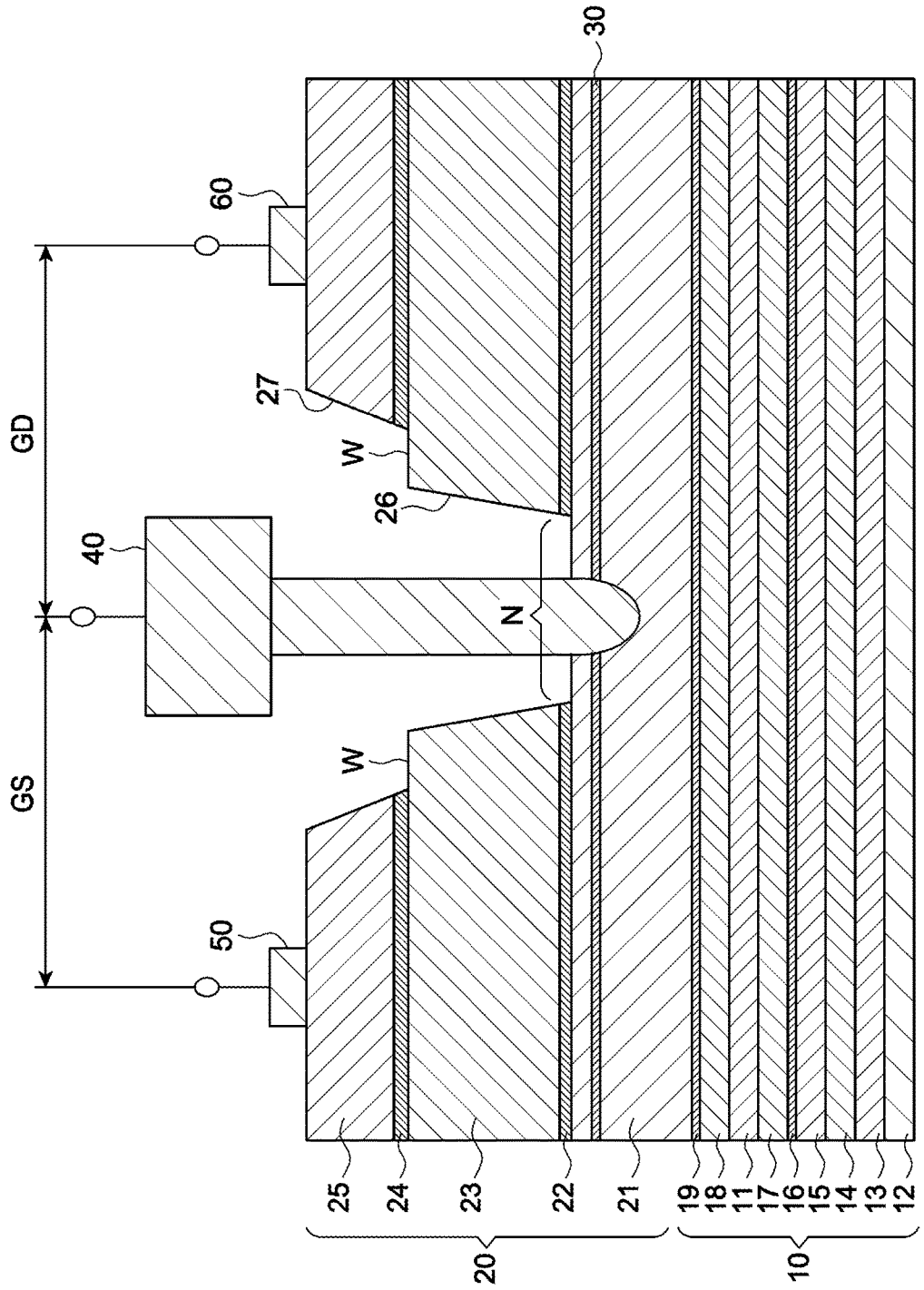
FIG. 7 is a schematic diagram of a field effect transistor of the third embodiment of the present invention.
Figure 8:
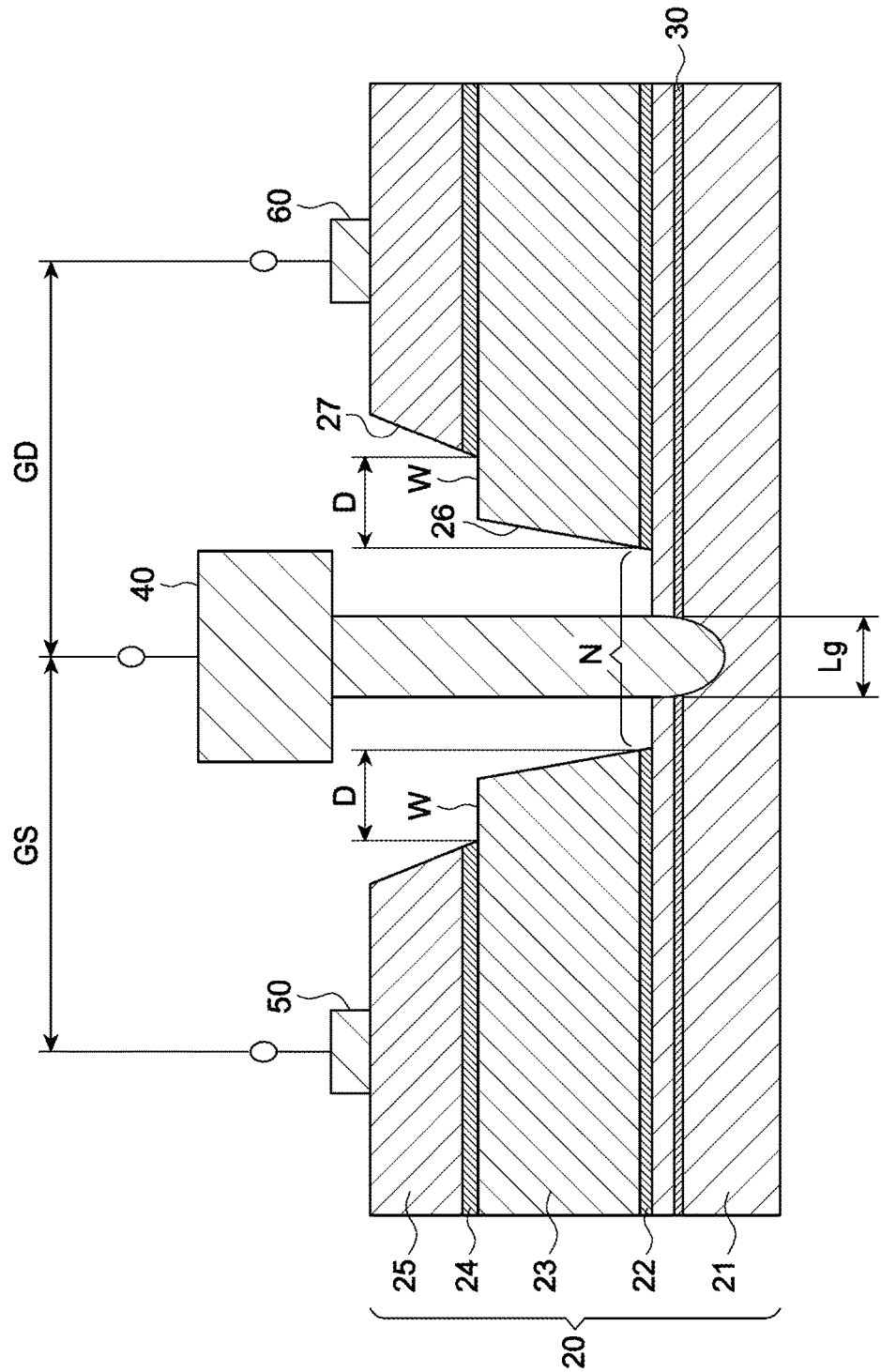
FIG. 8 is a schematic diagram illustrating the structure of the gate metal contact and the second semiconductor structure of the third embodiment of the present invention.

FIGS. 5-6 show the field effect transistor 70B of the second embodiment, the field effect transistor 70B is different from the field effect transistor 70A that the gate metal contact 40 is formed sequentially of Ti—Pt—Au, Ti—Pt—Au—Ti, Ti—Mo—Au, Ti—Mo—Au—Ti, Ti—Pd—Au, or Ti—Pd—Au—Ti on the upper surface of the Schottky layer 21 in the narrow recess area N, and the bottom Lg of the Pt layer 41 has a flat corner and flat interface, but the present invention is not limited to such application.

FIGS. 7-10 show the field effect transistor 70C of the third embodiment, the field effect transistor 70C is different from the field effect transistor 70A and 70B of the first and second embodiment that the delta-doped layer 30 is inserted into the narrow recess region N and the between the lower surface of the Schottky layer 21 and wherein the gate metal contact 40 is formed sequentially of Pt—Ti—Pt—Au, Pt—Ti—Pt—Au—Ti, Pt—Ti—Mo—Au, Pt—Ti—Mo—Au—Ti, Pt—Ti—Pd—Au, or Pt—Ti—Pd—Au—Ti on the upper surface of the Schottky layer 21 in the narrow recess area N and wherein a thermal treatment is performed to intermix the initial Pt layer 41 and the second semiconductor structure 20 material to form the gate metal contact 40 into the second semiconductor structure 20 junction below the upper surface of the Schottky layer 21 and additionally below the delta-doped layer 30 and in the narrow recess area N, and the bottom Lg of the Pt layer 41 has a rounded corner and flat interface, but the present invention is not limited to such application.

FIGS. 10-13 show the field effect transistor 70D of the fourth embodiment, the field effect transistor 70D is different from the field effect transistor 70C of the third embodiment in that the wide recess layer 23 and the first etch stop layer 22 is not included and the field effect transistor 70D is a single recess device.

Also, the thickness of the buffer layer 13 is 200 nm; the thickness of the super-lattice buffer layer 14 is 18.5/1.5 nm; the thickness of the transition layer 15 is 10-80 nm; the thickness of the delta-doped layer 16 is 1 ML, and the doping species is Si and the Si doping concentration is 0.5~1.5e12 cm−2; the thickness of the first spacer layer 17 is 3.5-4.0 nm; the thickness of the channel layer 11 is 8-15 nm; the thickness of the second spacer layer 18 is 3.5-4.5 nm; the thickness of the second delta-doped layer 19 is 1 ML, and the doping species is Si and the Si doping concentration is 3.5~5e12 cm−2, or the thickness of the buffer layer 13 is 200 nm; the thickness of the super-lattice buffer layer 14 is 18.5/1.5 nm; the thickness of the transition layer 15 is 40 nm; the thickness of the delta-doped layer 16 is 1 ML, and the doping species is Si and the Si doping concentration is 0.8e12 cm−2; the thickness of the first spacer layer 17 is 4.5 nm; the thickness of the channel layer 11 is 13 nm; the thickness of the second spacer layer 18 is 4.5 nm; the thickness of the second delta-doped layer 19 is 1 ML, and the doping species is Si and the Si doping concentration is 4.2e12 cm−2, the period of the super-lattice buffer layer 14 is 15.

Figure 3:
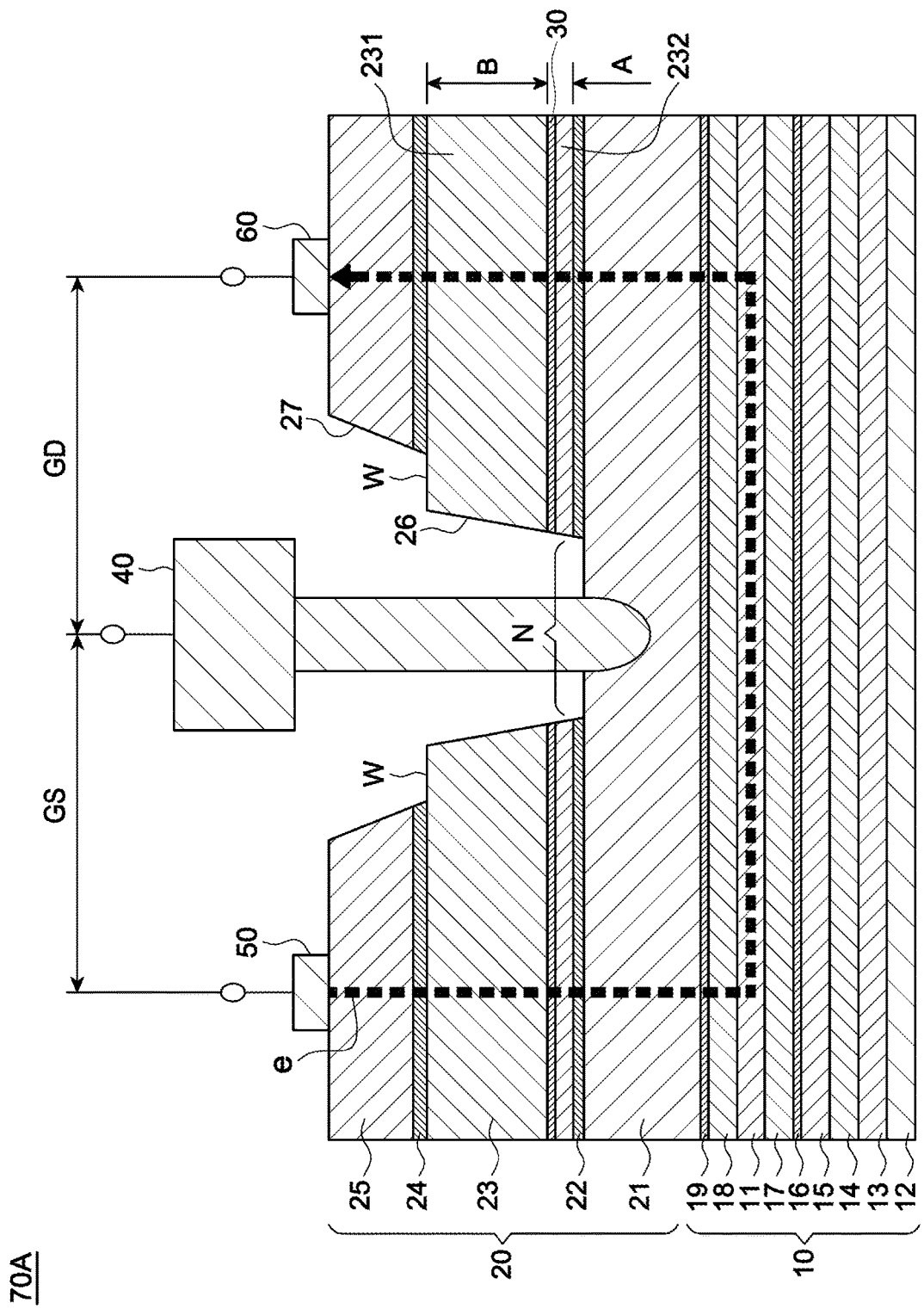
FIG. 3 is a schematic diagram illustrating the flow of the electron in the channel layer of the first embodiment of the present invention.
Figure 9:
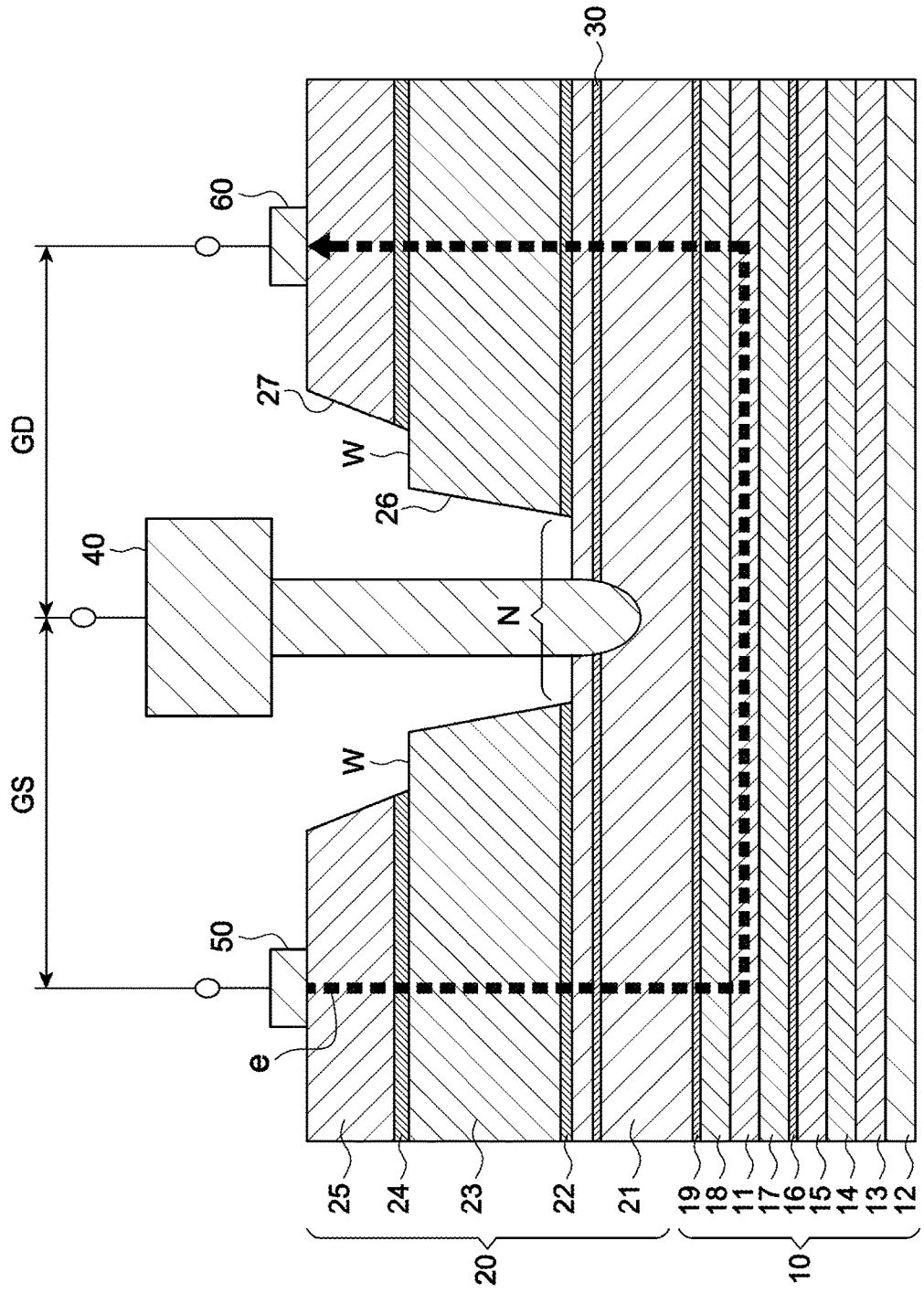
FIG. 9 is a schematic diagram illustrating the flow of the electron in the channel layer of the third embodiment of the present invention.
Figure 10:
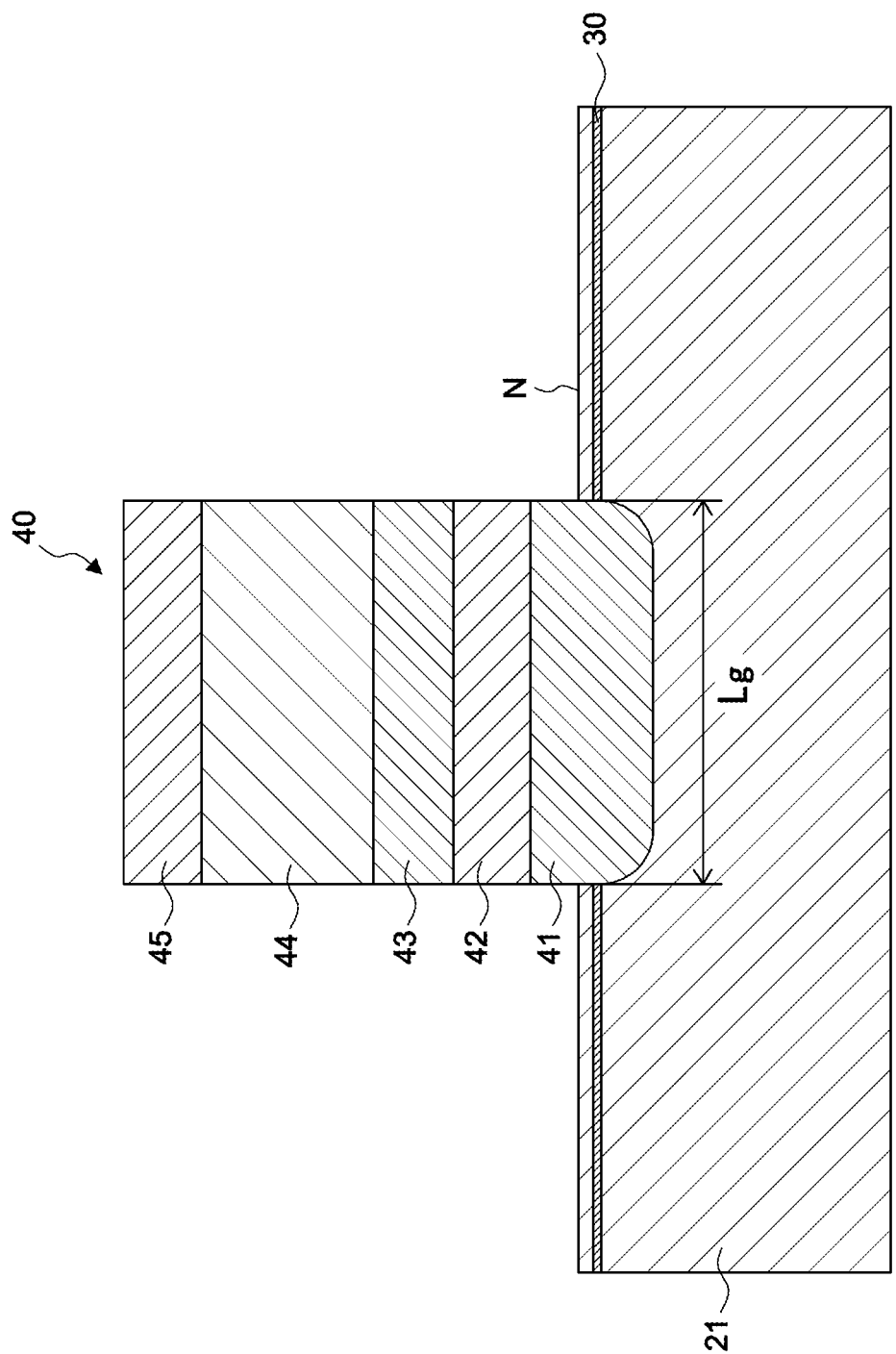
FIG. 10 is a schematic diagram illustrating the gate metal contact combining with the Schottky layer of the third embodiment of the present invention.
Figure 11:
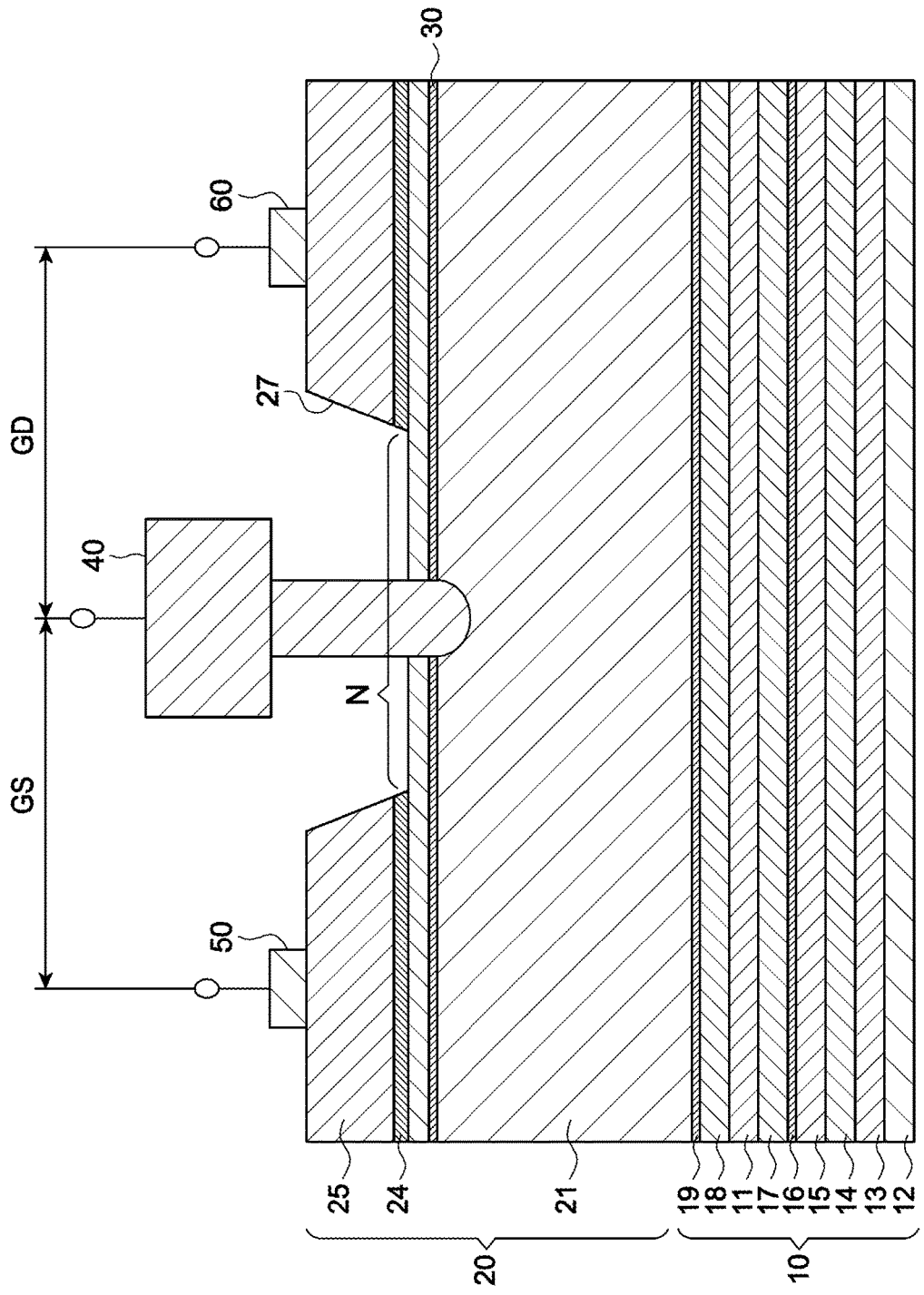
FIG. 11 is a schematic diagram of a field effect transistor of the fourth embodiment of the present invention.
Figure 12:
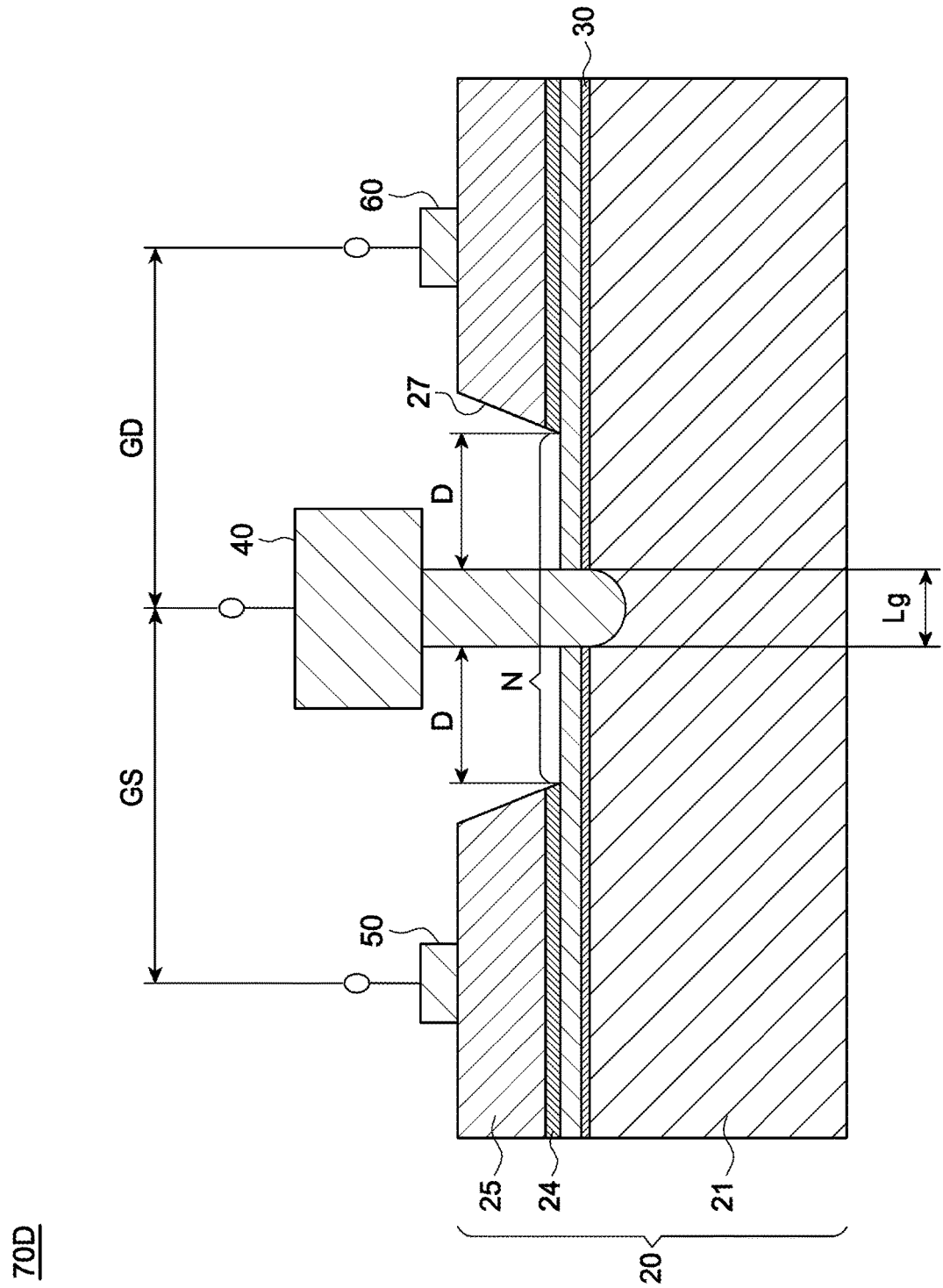
FIG. 12 is a schematic diagram illustrating the structure of the gate metal contact and the second semiconductor structure of the fourth embodiment of the present invention.
Figure 13:
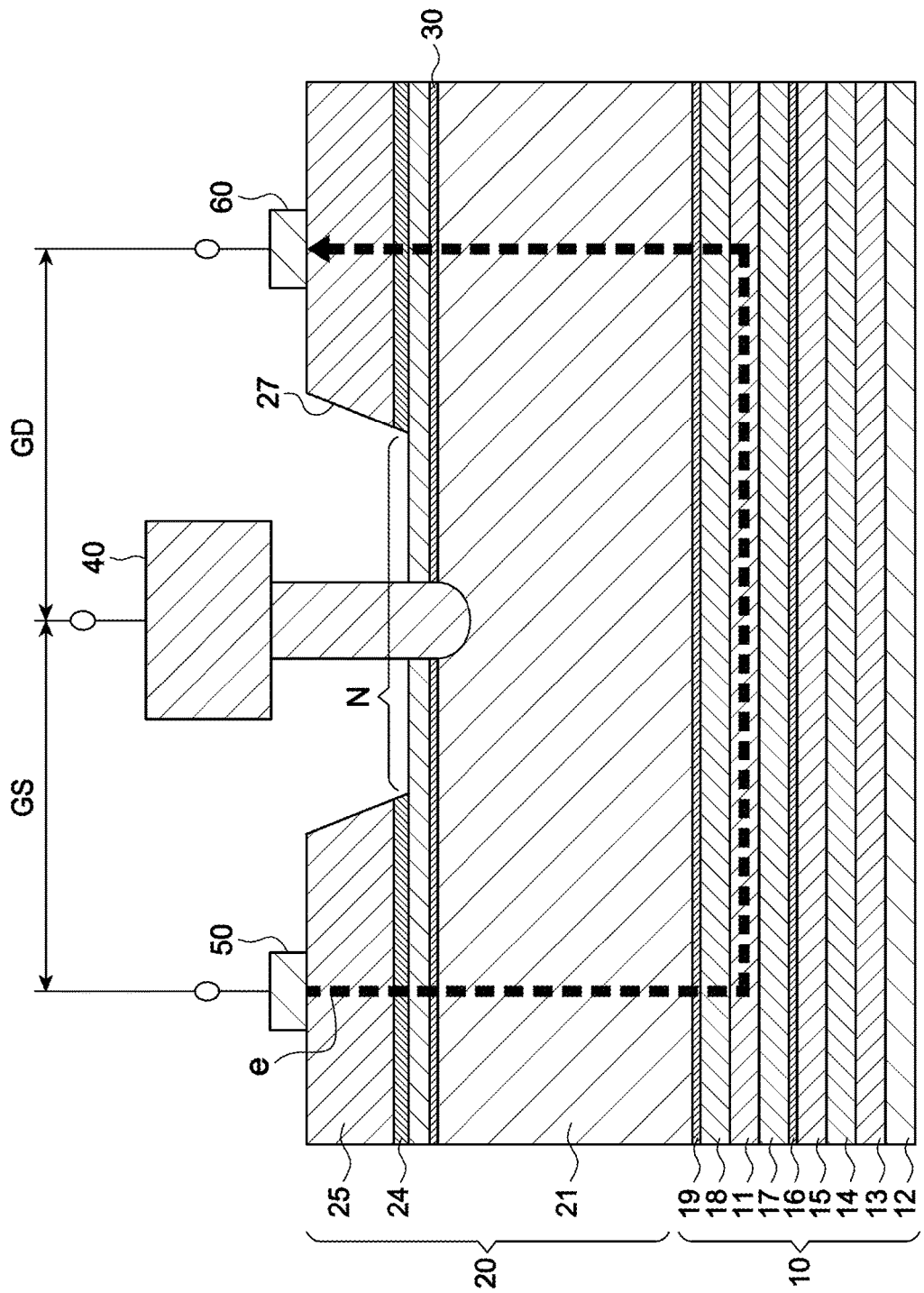
FIG. 13 is a schematic diagram illustrating the flow of the electron in the channel layer of the fourth embodiment of the present invention.
Figure 14:
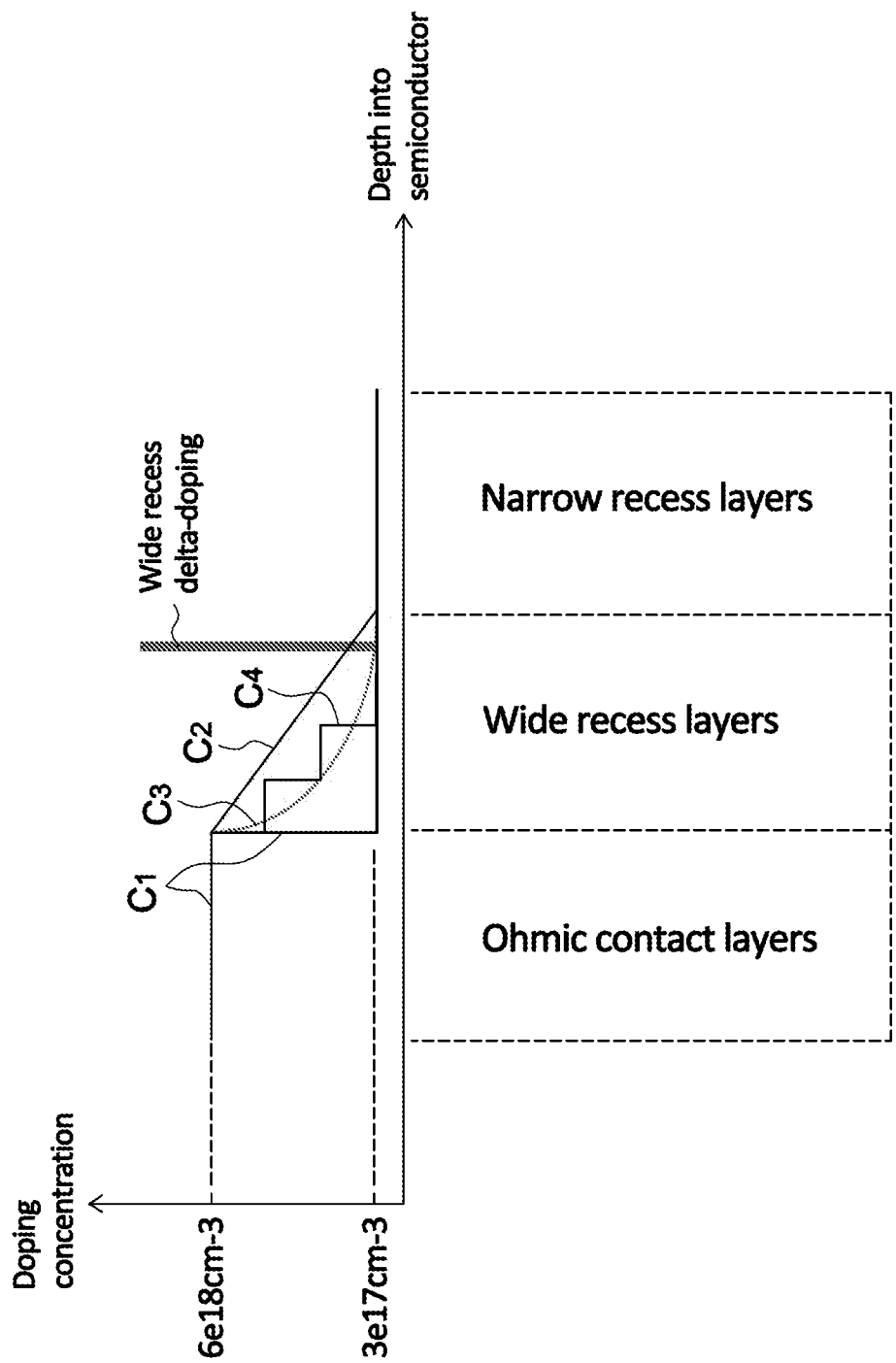
FIG. 14 is an n-type doping profile diagram within the wide recess layer.

With the features disclosed above, the wide recess layer 23 is n-type doped either at a uniform constant value or graded doping with the peak doping at the top surface of the wide recess 27. The graded doping is either linear, step-graded, quadratic-graded, exponential, or combination thereof, referring to FIG. 14, the distribution curve of the doping of the wide recess layer 23 is formed by a first curve C1, a second curve C2, a third curve C3, a fourth curve C4, furthermore, the first curve C1 is a constant and uniform profile, the second curve C2 is a linearly graded profile, the third curve C3 is an exponentially or quadratic graded profile, the fourth curve C4 is a step-graded profile, therefore, the delta-doped layer 30 of the wide recess layer 23 has below effects, at the Ohmic contact layer 25 of the source metal contact 50 and the drain metal contact 60, the electrons can be more efficiently injected from the source metal contact 50 into the channel layer 11 and from the channel layer 11 into the drain metal contact 60; and at the gate-source GS region, the electric field is reduced by the delta-doped layer 30, allowing the electrons e to flow more freely through the channel layer 11, reducing the confinement of electrons e in traps D, and reducing the resistance of the gate-source GS region, as shown in FIG. 3 and FIG. 9.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A field effect transistor comprising:
   a first semiconductor structure, the first semiconductor structure having a channel layer;
   a second semiconductor structure, the second semiconductor structure is arranged on the first semiconductor structure, and the second semiconductor structure is stacked in sequence from bottom to top with a Schottky layer, at least a first etch stop layer, a wide recess layer, an ohmic contact layer, and a narrow recess is opened in the wide recess layer, a wide recess is opened in the ohmic contact layer and the wide recess is located above the narrow recess, so that an upper surface of the wide recess layer forms a wide recess area and an upper surface of the Schottky layer forms a narrow recess area, said wide recess layer is formed by a first wide recess layer and a second wide recess layer, said first wide recess layer is positioned above said second wide recess layer;
   at least one delta-doped layer, the at least one delta-doped layer is sandwiched between said first wide recess layer and said second wide recess layer, a lower surface of said at least one delta-doped layer is displaced 1-10 nm from a bottom surface of the second wide recess layer of the wide recess layer, and wherein at least one of said first and second wide recess layers has a gradient doping profile that includes one of linear gradient, step gradient, quadratic gradient, exponential or a combination thereof;
   a gate metal contact, the gate metal contact is formed inside the wide recess and at a bottom surface of the narrow recess, within the narrow recess area;
   a source metal contact, the source metal contact is arranged on the ohmic contact layer, and the source metal contact is located on a first side of the gate metal contact; and
   a drain metal contact, the drain metal contact is arranged on the ohmic contact layer, and the drain metal contact is located on a second side of the gate metal contact.

2. The field effect transistor as claimed in claim 1, wherein the wide recess layer is n-type doped to form a graded doping with peak doping at a top surface of the wide recess or within 5 nm of a top surface of the wide recess.

3. The field effect transistor as claimed in claim 1, wherein the field effect transistor is a high electron mobility transistor, a pseudo-morphic high electron mobility transistor (pHEMT), a heterostructure FET (HFET), or a modulation-doped FET (MODFET).

4. The field effect transistor as claimed in claim 3, wherein the field effect transistor is a depletion-mode, normally-on transistor or an enhancement-mode, normally-off transistor.

5. The field effect transistor as claimed in claim 4, wherein the at least one delta-doped layer is formed of epitaxy materials which are grown by molecular beam epitaxy (MBE), metallo-organic chemical vapor deposition (MOCVD) or a combination thereof.

6. The field effect transistor as claimed in claim 5, wherein a thickness of an MBE grown delta-doped layer is 1 to 2 monolayers (ML) thick, 0.5 to 1.2 nm.

7. The field effect transistor as claimed in claim 5, wherein a thickness of an MOCVD grown delta-doped layer is one to a few monolayers thick.

8. The field effect transistor as claimed in claim 5, wherein the epitaxy materials are Gallium Arsenide (GaAs) based materials.

9. The field effect transistor as claimed in claim 1, wherein a material of the first wide recess layer and the second wide recess layer is n-type AlGaAs.

10. The field effect transistor as claimed in claim 1, wherein a thickness of the first wide recess layer is 10-20 nm; and a doping species of the first and second wide recess layers is Si and the Si doping concentration is 1~5e17 cm−3.

11. The field effect transistor as claimed in claim 1, wherein a thickness of the first wide recess layer is 9 nm, a thickness of the second wide recess layer is 1 nm, a doping species is Si and the Si doping concentration is 3e17 cm−3.

12. The field effect transistor as claimed in claim 1, wherein the gate metal contact is formed sequentially of Ti—Pt—Au, Ti—Pt—Au—Ti, Ti—Mo—Au, Ti—Mo—Au—Ti, Ti—Pd—Au, Ti—Pd—Au—Ti on an upper surface of the Schottky layer in the narrow recess area.

13. The field effect transistor as claimed in claim 1, wherein the second semiconductor structure includes a second etch stop layer, the second etch stop layer is arranged between the wide recess layer and the ohmic contact layer.

14. The field effect transistor as claimed in claim 13, wherein a material of the Schottky layer is n-type AlGaAs; a material of the first etch stop layer is n-type InGaP or n-type AlAs, a material of the wide recess layer is n-type AlGaAs, a material of the at least one delta-doped layer is n-type GaAs or n-type AlGaAs, a material of the second etch stop layer is n-type InGaP or n-type AlAs, a material of the ohmic contact layer is n-type GaAs or n-type InGaAs, or combination thereof.

15. The field effect transistor as claimed in claim 13, wherein the Schottky layer has a thickness of 5-20 nm and a doping species is Si and the Si doping concentration is 1~3e17 cm−3, a thickness of the first etch stop layer is 5 nm, a doping species is Si and the Si doping concentration is greater than 1e19 cm−3, a thickness of the at least one delta-doped layer is 1 monolayer (ML), a doping species is Si and the Si doping concentration is 0.5~1.5e12 cm−2, a thickness of the second etch stop layer is 5 nm, a doping species is Si and the Si doping concentration is greater than 1e19 cm−3, a thickness of the ohmic contact layer is 20-120 nm, a doping species is Si, and the Si doping concentration is greater than 5e18 cm−3.

16. The field effect transistor as claimed in claim 13 wherein the Schottky layer has a thickness of 10 nm and a doping species is Si and the Si doping concentration is 3e17 cm−3, a thickness of the first etch stop layer is 5 nm, a doping species is Si and the Si doping concentration is greater than 1e19 cm−3, a thickness of the at least one delta-doped layer is 1 monolayer (ML), a doping species is Si and the Si doping concentration is 1.0e12 cm−2, a thickness of the second etch stop layer is 5 nm, a doping species is Si, and the Si doping concentration is greater than 1e19 cm−3, a thickness of the ohmic contact layer is 50 nm, a doping species is Si and the Si doping concentration is greater than 5e18 cm−3.

17. The field effect transistor as claimed in claim 1, wherein the first semiconductor structure includes a substrate, a buffer layer, a super-lattice buffer layer, a transition layer, a first delta-doped layer and a second delta-doped layer, a first spacer layer, a second spacer layer, and the first semiconductor structure stacks the substrate, the buffer layer, and the super-lattice buffer layer, the transition layer, the first delta-doped layer, the first spacer layer, the channel layer, the second spacer layer and the second delta-doped layer sequentially from bottom to top.

18. The field effect transistor as claimed in claim 17, wherein a material of the substrate is semi-insulating GaAs or InP, a material of the buffer layer is unintentionally-doped GaAs, a material of the super-lattice buffer layer is AlGaAs/GaAs, a material of the transition layer is unintentionally-doped GaAs, a material of the first delta-doped layer is n-type GaAs, a material of the first spacer layer is unintentionally-doped AlGaAs, a material of the channel layer is unintentionally-doped InGaAs, a second spacer layer material is unintentionally-doped AlGaAs, a material of the second delta-doped layer is n-type GaAs.

19. A field effect transistor comprising:
a first semiconductor structure, the first semiconductor structure having a channel layer;
a second semiconductor structure, the second semiconductor structure is arranged on the first semiconductor structure, and the second semiconductor structure is stacked in sequence from bottom to top with a Schottky layer, a first etch stop layer, a wide recess layer, an ohmic contact layer, and a narrow recess is opened in the wide recess layer, a wide recess is opened in the ohmic contact layer and the wide recess is located above the narrow recess, so that an upper surface of the wide recess layer forms a wide recess area and an upper surface of the Schottky layer forms a narrow recess area;
at least one delta-doped layer, the at least one delta-doped layer is displaced 1-10 nm from a bottom surface of the wide recess layer and the wide recess layer has a gradient doping profile that includes one of linear gradient, step gradient, quadratic gradient, exponential or a combination thereof;
a gate metal contact, the gate metal contact is formed inside the wide recess and at a bottom surface of the narrow recess, within the narrow recess area;
a source metal contact, the source metal contact is arranged on the ohmic contact layer, and the source metal contact is located on a first side of the gate metal contact; and
a drain metal contact, the drain metal contact is arranged on the ohmic contact layer, and the drain metal contact is located on a second side of the gate metal contact.

\* \* \* \* \*